United States Patent
Dewitt et al.

(10) Patent No.: US 9,035,719 B2
(45) Date of Patent: May 19, 2015

(54) THREE DIMENSIONAL BRANCHLINE COUPLER USING THROUGH SILICON VIAS AND DESIGN STRUCTURES

(71) Applicants: INTERNATIONAL BUSINESS MACHINES CORPORATION, Armonk, NY (US); University of South Carolina, Columbia, SC (US)

(72) Inventors: Barbara S. Dewitt, Essex Junction, VT (US); Essam Mina, South Burlington, VT (US); BM Farid Rahman, West Columbia, SC (US); Guoan Wang, Irmo, SC (US); Wayne H. Woods, Jr., Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 13/974,659

(22) Filed: Aug. 23, 2013

(65) Prior Publication Data
US 2015/0054595 A1 Feb. 26, 2015

(51) Int. Cl.
| | |
|---|---|
| *H01P 5/12* | (2006.01) |
| *H01P 3/00* | (2006.01) |
| *G06F 17/50* | (2006.01) |
| *H01L 21/768* | (2006.01) |

(52) U.S. Cl.
CPC ............ *H01P 3/003* (2013.01); *G06F 17/5077* (2013.01); *H01L 21/76879* (2013.01)

(58) Field of Classification Search
USPC .......... 333/109, 113, 117, 202, 204, 208, 212
See application file for complete search history.

(56) References Cited

U.S. PATENT DOCUMENTS

2013/0154759 A1* 6/2013 Morita et al. .................. 333/26

OTHER PUBLICATIONS

Hettak, K. et al., "A Novel Compact Three-Dimensional CMOS Branch-Line Coupler Using the Meandering ECPW, TFMS, and Buried Micro Coaxial Technologies at 60 GHz", IEEE, 2010, pp. 1576-1579.
Kuo, C.-Y et al., "Miniature 60 GHz Slow-Wave CPW Branch-Line Coupler Using 90 nm Digital CMOS Process", Electronics Letters, vol. 47, No. 16, Aug. 4, 2011, 2 pages.
Wang, G. et al., "Novel On-Chip High Performance Slow Wave Structure using Discontinuous Microstrip Lines and Multi-Layer Ground for Compact Millimeter Wave Applications", IEEE, Electronic components and Technology Conference, 2009, pp. 1606-1611.
Li, B. et al., "Compact Dual-Band Branch-Line Coupler with 20:1 Power Dividing Ratio", J. of Electromagn. Waves and Applications., vol. 25, 607-615, 2011, 1-10 pages.

* cited by examiner

*Primary Examiner* — An Luu
(74) *Attorney, Agent, or Firm* — Anthony Canale; Roberts Mlotkowski Safran & Cole, P.C.

(57) ABSTRACT

A three dimensional (3D) branchline coupler using through silicon vias (TSV), methods of manufacturing the same and design structures are disclosed. The method includes forming a first waveguide structure in a first dielectric material. The method further includes forming a second waveguide structure in a second dielectric material. The method further includes forming through silicon vias through a substrate formed between the first dielectric material and the second dielectric material, which connects the first waveguide structure to the second waveguide structure.

20 Claims, 8 Drawing Sheets

US 9,035,719 B2

THREE DIMENSIONAL BRANCHLINE COUPLER USING THROUGH SILICON VIAS AND DESIGN STRUCTURES

FIELD OF THE INVENTION

The invention relates to integrated circuits and, more particularly, to a three dimensional (3D) branchline coupler using through silicon vias (TSV), methods of manufacturing the same and design structures.

BACKGROUND

A branchline coupler is a quadrature coupler, consisting of circuitry in an entirely single plane of a semiconductor device. For example, the branchline coupler consists of four strip line ports coupled to each other by two transversal lines or bridges, all of which lay in a same plane. In an ideal branchline coupler, each transmission line is a quarter wavelength; although, other wavelengths are also possible such as 3/4, 5/4 or 7/4 wavelengths (etc.). In operation, for example, a signal entering a Vin port is split into two quadrature signals, with the remaining port fully isolated from the input port at the center frequency.

In a branchline coupler, bond wires for the common ground add inductances and make the branchline coupler more susceptible to ground bounce and performance degradation. Also, as the branchline coupler consists of circuitry in an entirely single plane, valuable chip real estate is realized in the fabrication of the branchline coupler.

SUMMARY

In a first aspect of the invention, a method comprises forming a first waveguide structure in a first dielectric material. The method further comprises forming a second waveguide structure in a second dielectric material. The method further comprises forming through silicon vias through a substrate formed between the first dielectric material and the second dielectric material, which connects the first waveguide structure to the second waveguide structure.

In another aspect of the invention, a structure comprises a first waveguide structure in a first dielectric material and a second waveguide structure in a second dielectric material. The structure further comprises through silicon vias through a substrate formed between the first dielectric material and the second dielectric material, which connects the first waveguide structure to the second waveguide structure. The first waveguide structure is formed with a first port, Vin, split into two quadrature signals at second and third of equal amplitude and with a 90° phase difference of the second waveguide structure.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a three dimensional (3D) branchline coupler using through silicon vias, and integrated circuit containing the same, which comprises the structures of the present invention. In still further embodiments, a method in a computer-aided design system is provided for generating a functional design model of the 3D coupler using through silicon vias. The method comprises generating a functional representation of the structural elements of the 3D branchline coupler using through silicon vias.

In embodiments, a design structure readable by a machine is used in design, manufacture, or simulation of an integrated circuit. The design structure being implemented in the machine, comprises: a first waveguide structure in a first dielectric material; a second waveguide structure in a second dielectric material; and through silicon vias through a substrate formed between the first dielectric material and the second dielectric material, which connects the first waveguide structure to the second waveguide structure. The first waveguide structure is formed with a first port, Vin, split into two quadrature signals at second and third of equal amplitude and with a 90° phase difference of the second waveguide structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to a three dimensional (3D) branchline coupler using through silicon vias (TSV), methods of manufacturing and design structures. In embodiments, the branchline coupler of the present invention can be used in I/Q up/down converters and balanced amplifiers for wireless communication systems. The branchline coupler of the present invention also provides added flexibility compared to conventional 2D planar couplers, e.g., the center frequency and size can to scaled up or down for the desired center frequency and applications.

In embodiments, TSVs are used in the design of an ultra miniature 3D branchline coupler for Millimeter Wave/Terahertz applications. In embodiments, two vertical arms of the branchline coupler of the present invention use the TSVs; instead of 2D wiring of conventional couplers. This significantly reduces the on chip area compared to the conventional branchline couplers which consists of four arms totally constructed by the 2D wiring. In further embodiments, two horizontal arms of the branchline coupler of the present invention use the top metal wiring layer of the back end of the line (BEOL) and the redistribution layers (RDL) (e.g., wiring layer at the bottom of the TSV structure). In embodiments, each arm length, e.g., vertical or horizontal, can be a quarter wavelength at the center frequency of the branchline coupler.

Advantageously, the 3D branchline coupler of the present invention consumes a very small chip area at millimeter-wave and Terahertz frequency bands which makes it very attractive, compared to lower frequency branchline couplers using on-chip lumped passive devices. Specifically, by implementing the 3D branchline coupler of the present invention, a significant chip area reduction is obtained, e.g., greater than 75%, compared to a conventional 2D branchline coupler formed in back end of the line (BEOL) processes, e.g., planar branchline couplers. Moreover, the 3D branchline coupler of the present invention does not require any bond wires to connect the common ground (e.g., compared to a conventional branchline coupler), thereby eliminating any added inductances, while also eliminating ground bounce. Accordingly, implementing the 3D branchline coupler of the present invention will avoid performance degradation issues compared to conventional systems.

Figure 1:
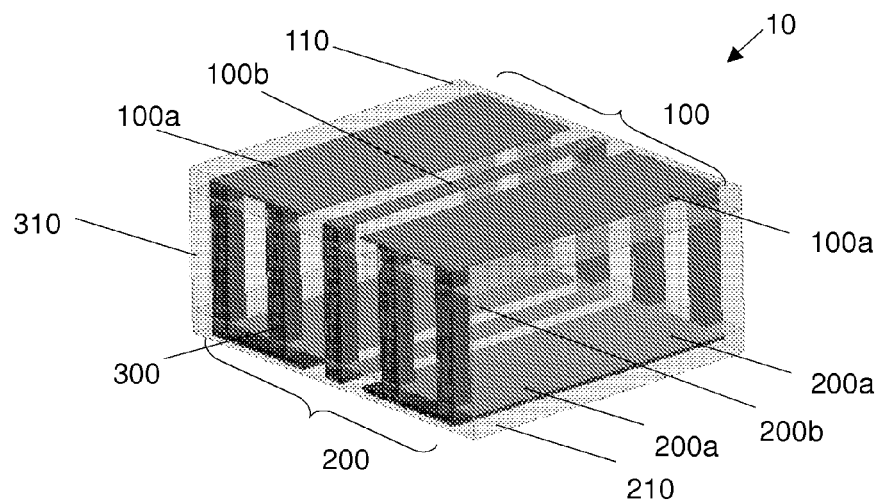
FIG. 1 shows a structure and respective manufacturing steps in accordance with aspects of the present invention.

FIG. 1 shows a 3D branchline coupler and methods of manufacturing in accordance with aspects of the present invention. It should be understood by those of skill in the art that the 3D branchline coupler and other components, e.g., TSVs, etc. of the present invention, can be manufactured in a number of ways using a number of different tools. In general, though, the methodologies and tools used to form the structures of the present invention can be adopted from integrated circuit (IC) technology. For example, the structures of the present invention, e.g., signal lines, ground plates, inductance lines, etc., are built on wafers and are realized in films of materials patterned by photolithographic processes. In particular, the fabrication of structures uses three basic building blocks: (i) deposition of films of material on a substrate, (ii) applying a patterned mask on top of the films by photolithographic imaging, and (iii) etching the films selectively to the mask.

More specifically, the structure 10 of FIG. 1 includes an upper coplanar waveguide structure 100 and a lower coplanar waveguide structure 200, connected by a plurality of TSVs 300. In embodiments, the plurality of TSVs 300 are formed at an approximate 90 degree angle from the upper coplanar waveguide structure 100 and the lower coplanar waveguide structure 200, thereby considerably reducing chip area. In embodiments, the upper coplanar waveguide structure 100 comprises upper ground plates 100a, 100a formed on opposing sides of a signal line 100b. Similarly, the lower coplanar waveguide structure 200 comprises lower ground plates 200a, 200a formed on opposing sides of a signal line 200b. In embodiments, the upper coplanar waveguide structure 100 and the lower coplanar waveguide structure 200 are formed in a dielectric material 110 and 210, respectively, formed on opposing surfaces of a substrate 310, e.g., silicon. More specifically, in embodiments, the upper coplanar waveguide structure 100 is formed in a top oxide layer 110; whereas, the lower coplanar waveguide structure 200 is formed in a back oxide layer 210.

In embodiments, the upper coplanar waveguide structure 100, lower coplanar waveguide structure 200 and TSVs 300 can be fabricated using conventional CMOS processes, with the TSVs 300 connected to ends of each of the ground plates and signal lines of the upper coplanar waveguide structure 100 and lower coplanar waveguide structure 200. More specifically, in embodiments, the signal lines and ground plates of the upper coplanar waveguide structure 100 and lower coplanar waveguide structure 200, and, in embodiments, the TSVs 300, are fabricated from any metal or metal alloy material using conventional lithographic, etching and deposition processes commonly employed in CMOS fabrication (e.g., using an additive or subtractive metal process). For example, in embodiments, the metal or metal alloy can be deposited using conventional deposition processes such as, for example, atomic layer deposition (ALD), metal sputtering, or a chemical vapor deposition (CVD), amongst other deposition methods. The metal or metal alloy can be any known metal or metal alloy, suitable for its particular purpose, e.g., copper damascene structures. In embodiments, the dielectric layers of the present invention can be, for example, $SiO_2$, deposited prior to or after the deposition of the metal or metal alloy.

By way of more specific example, dielectric layers 110 and 210 can be deposited on opposing sides of the substrate 310 using, for example, a conventional chemical vapor deposition (CVD) process. After deposition of the dielectric layers 110 and 210 on opposing sides of the substrate 310, a resist layer can be placed on one of the dielectric layers 110 and 210 and exposed to light to form patterns, corresponding with a pattern of the TSVs 300. The dielectric layers 110 and 210 and the substrate 300 are then patterned, e.g., etched, to form vias. This etching can be, for example, conventional processes such as reactive ion etching (RIE). After etching, the resist may be removed using a conventional ashing or stripping process. A metal or metal alloy layer, e.g., copper or tungsten, is then deposited in the vias to form the TSVs 300. Any residual metal or metal alloy can then be removed using chemical mechanical polishing (CMP).

In embodiments, the signal line 100b and the ground plates 100a of the upper coplanar waveguide structure 100 can be formed in the same processing steps, in a same plane. Similarly, the signal line 200b and the ground plates 200a of the lower coplanar waveguide structure 200 can be formed in the same processing steps, in a same plane. In embodiments, the ends of the signal lines and ground plates of the respective upper coplanar waveguide structure 100 and lower coplanar waveguide structure 200 are connected together by the TSVs 300. In this way, bonding wires are no longer required. In embodiments, the signal lines and the ground plates can be formed using a damascene process using an additive or subtractive process.

Specifically and by way of one example, after deposition of the dielectric layers 110 and 210, resist layers can be formed on the layers 110 and 210 and exposed to light to form patterns, corresponding with the shapes of the signal lines and ground plates. The exposed regions of the insulating layer are then etched to form trenches using conventional processes such as, for example, reactive ion etching. A metal or metal alloy layer is then deposited in the trenches to form the signal lines and the ground plates. The metal or metal alloy can then undergo a chemical mechanical polishing (CMP) process.

In embodiments, the signal lines and the ground plates can have uniform width and lengths; although many different configurations are contemplated by the present invention. For example, the signal lines and the ground plates can have a varied thickness or different lengths, etc. Inductance and capacitance can thus be tuned by varying the widths, spacing between the signal lines and the ground plates, as well as the thickness. In embodiments, the signal lines and ground plates have widths of 6 μm and depths of 1.2 μm and are made of Cu. In other embodiments, the width, depth and length of the Cu segments may be different.

Figure 2:
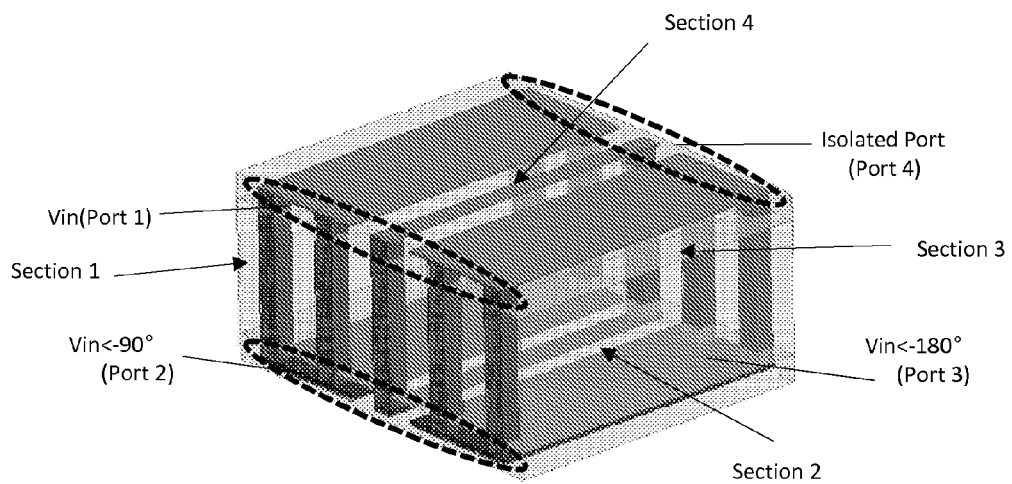
FIG. 2 shows additional aspects of the structure of FIG. 1 in accordance with aspects of the present invention.

As shown in FIG. 2, for example, the structure 10 includes four ports: port 1, port 2, port 3 and port 4. In embodiments, ports 1, 2 and 3 are Vin and port 4 is isolated from the input Vin of port 1. In embodiments, the Vin of port 1 is the input port for the structure 10 of the present invention. Vin of port 2 is at Vin <−90° with respect to Vin of port 1; whereas, Vin of port 3 is at Vin <−180° with respect to Vin of port 1. In other words, port 1 is split into two quadrature signals at ports 2 and 3 of equal amplitude and with a 90° phase difference. In this way, for example, by placing 1V at Vin of port 1, Vin of ports 2 and 3 will have, for example, 0.707V (e.g., a delayed output).

Also, in the configuration of the structure 10 of the present invention, 50 ohm at sections 2 and 4 will translate into 35.35 ohms in sections 1 and 3 as realized by the TSVs.

In embodiments, the structure 10 shown in FIGS. 1 and 2 provides a significant reduction in area, compared to a conventional branchline coupler structure. In any of the embodiments described herein, further reduction in the area of the branchline coupler can be obtained by meandering in the horizontal sections.

Figure 3:
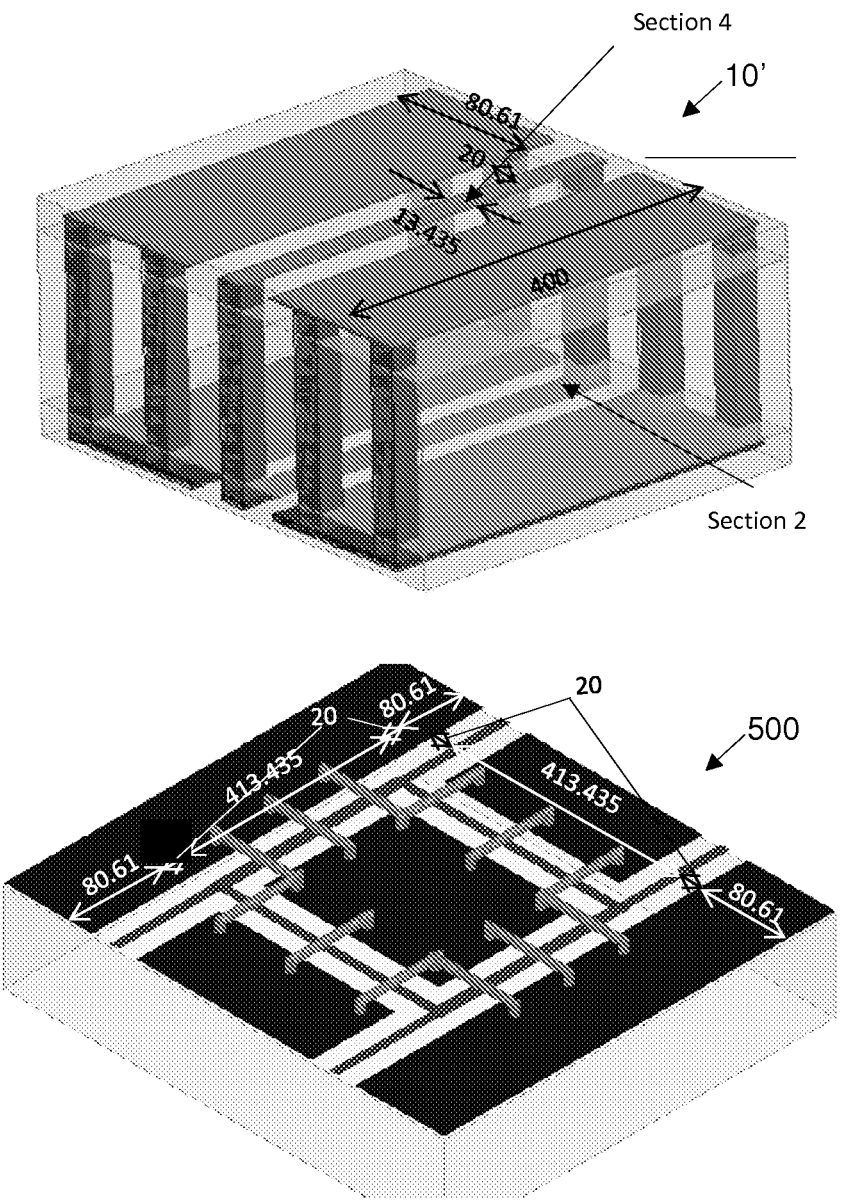
FIGS. 3-5 show area reduction comparisons between structures of the present invention and conventional branchline couplers.

By way of first example, and referring to FIG. 3 and Table 1 below, a 77.27% area reduction can be achieved for a 72 GHz branchline coupler using a 300 μm TSV, compared to a conventional branchline coupler shown at reference numeral 500. In the example, of FIG. 3, the ground plates of the branchline coupler 10' have a length of 400 μm and the dielectric layers have an effective dielectric constant of about 6.4.

TABLE 1

| BRANCHLINE COUPLER 10' | BRANCHLINE COUPLER 500 |
|---|---|
| Width of section 2 and section 4: signal line width (13.435 μm) + 2 * gap between the signal line to the ground plate (2 * 20 μm) + 2 * width of ground plate (2 * 80.61 μm) = 214.655 μm. | One length is: signal line length (400 μm + 13.435 μm (i.e., 413.435 μm)) + 2 * gap from signal line to the ground plate (2 * 20 μm) + 2 * width of ground plate (2 * 80.61 μm) = 614.655 μm. |
| Area of the 3D branchline coupler 10': 400 μm * 214.655 μm = 85,862 μm². | Area of the branchline coupler 500: 614.655 μm * 614.655 μm = 377,800.769 μm². |

Figure 4:
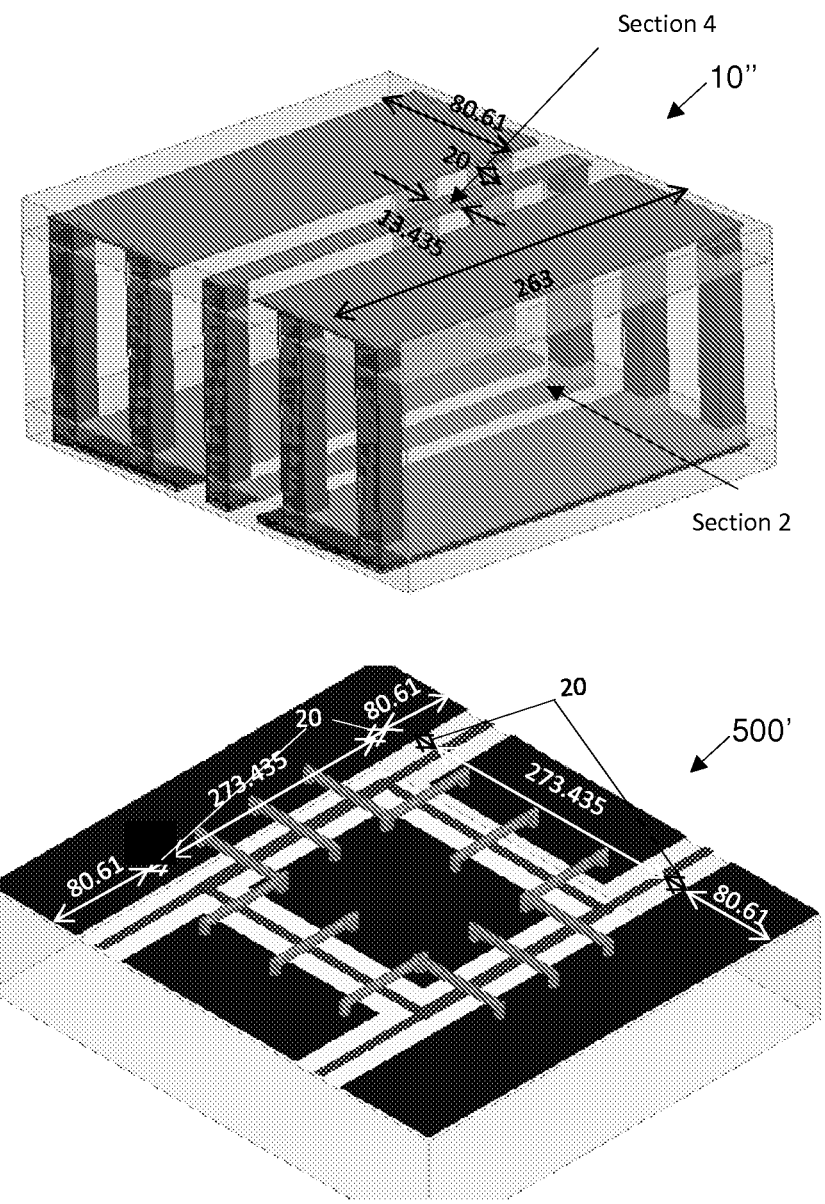

By way of second example and referring to FIG. 4 and Table 2, a 75.25% area reduction can be achieved for a 110 GHz branchline coupler using a 200 μm TSV, compared to a conventional branchline coupler shown at reference numeral 500'. In the example of FIG. 4, the ground plates of the GHz branchline coupler 10" have a length of 263 μm and the dielectric layers have an effective dielectric constant of about 6.4.

TABLE 2

| BRANCHLINE COUPLER 10" | BRANCHLINE COUPLER 500' |
|---|---|
| Width of section 2 and section 4: signal line width (13.435 μm) + 2 * gap between the signal line to the ground plate (2 * 20 μm) + 2 * width of ground plate (2 * 13.435 μm) = 214.655 μm. | One length is 477.649 μm. |
| Area of the 3D branchline coupler 10": 263 μm * 214.655 μm = 56,454.265 μm². | Area of the branchline coupler 500': 477.64 μm * 477.649 μm = 228,148.57 μm². |

Figure 5:
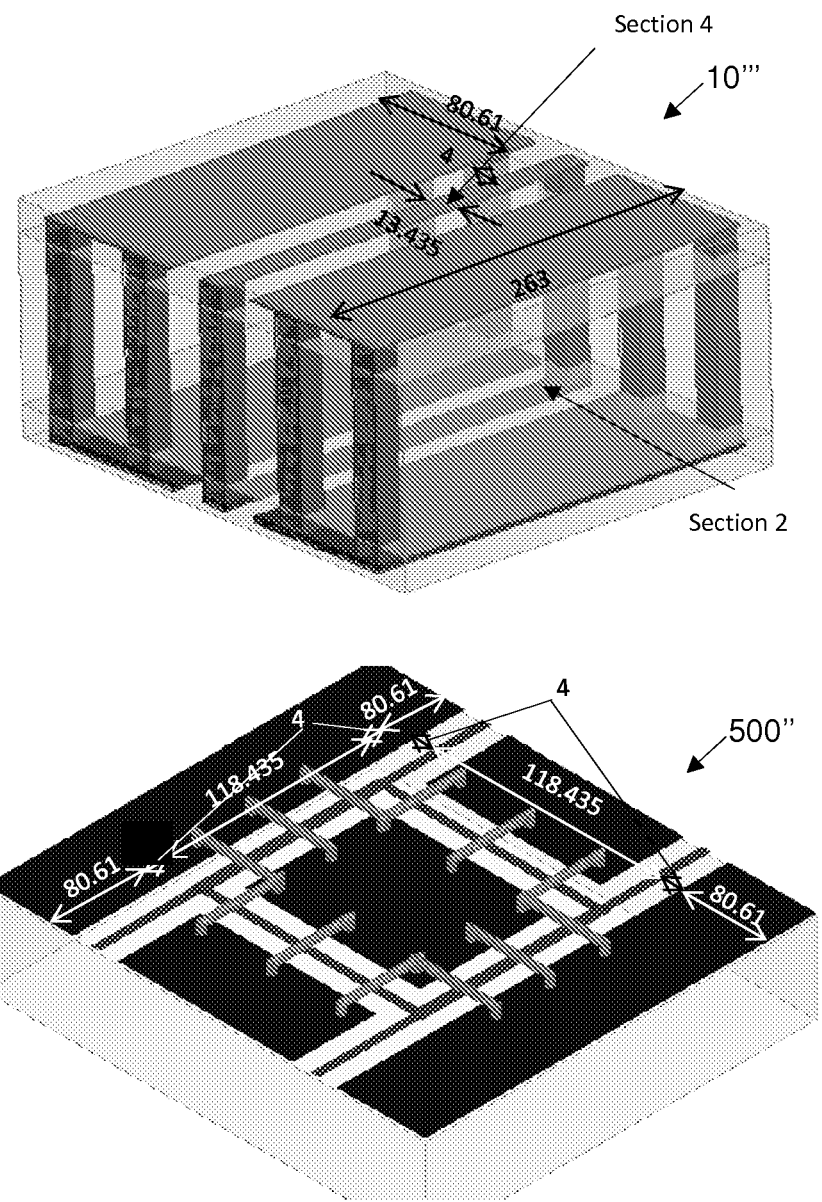

By way third example and referring to FIG. 5 and Table 3, a 76.83% area reduction can be achieved for a 300 GHz branchline coupler using a 73 μm TSV, compared to a conventional branchline coupler shown at reference numeral 500". In the example of FIG. 5, the ground plates of the GHz branchline coupler 10' have a length of 105 μm and the dielectric layers have an effective dielectric constant of about 6.4.

TABLE 3

| BRANCHLINE COUPLER 10''' | BRANCHLINE COUPLER 500" |
|---|---|
| Width of section 2 and section 4: signal line width (13.435 μm) + 2 * gap between the signal line to the ground plate (2 * 4 μm) + 2 * width of ground plate (2 * 13.435 μm) = 182.655 μm. | |
| Area of the 3D branchline coupler 10''': 105 μm * 182.655 μm = 19,178.775 μm². | Area of the branchline coupler 500": 287.655 μm * 287.655 μm = 82,745.399 μm². |

FIGS. 6-10 show various performance graphs of structures implementing aspects of the present invention. More specifically, FIGS. 6-10 show various performance graphs of the structure shown in FIG. 3, e.g., a 72 GHz 3D branchline coupler. These graphs show that the characteristic impedance of the vertical section (TSVs) is equal to the characteristic impedance of the horizontal section (signal and ground plates) divided by the square root of 2 and that the two outputs are of equal amplitude and with 90° phase difference fulfilling the necessary conditions of the branchline coupler. Similar performance achievements are also obtained with the structures described with regard to FIGS. 4 and 5.

Figure 6:
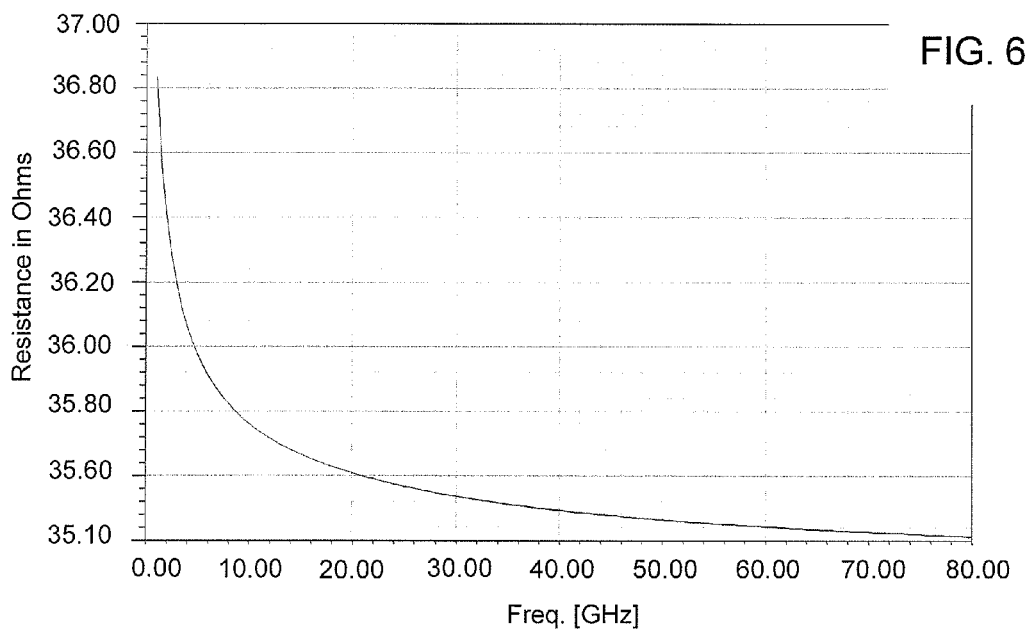
FIGS. 6-10 show various performance graphs of structures implementing aspects of the present invention.

FIG. 6 shows impedance for a vertical section of the 3D branchline coupler in accordance with aspects of the present invention. In FIG. 6, the x axis is frequency and the y axis is resistance in ohms. More particularly, FIG. 6 shows that at a frequency of 72 GHz, the resistance is about 35.5 ohms in the vertical section (as discussed with regard to FIGS. 1 and 2).

Figure 7:
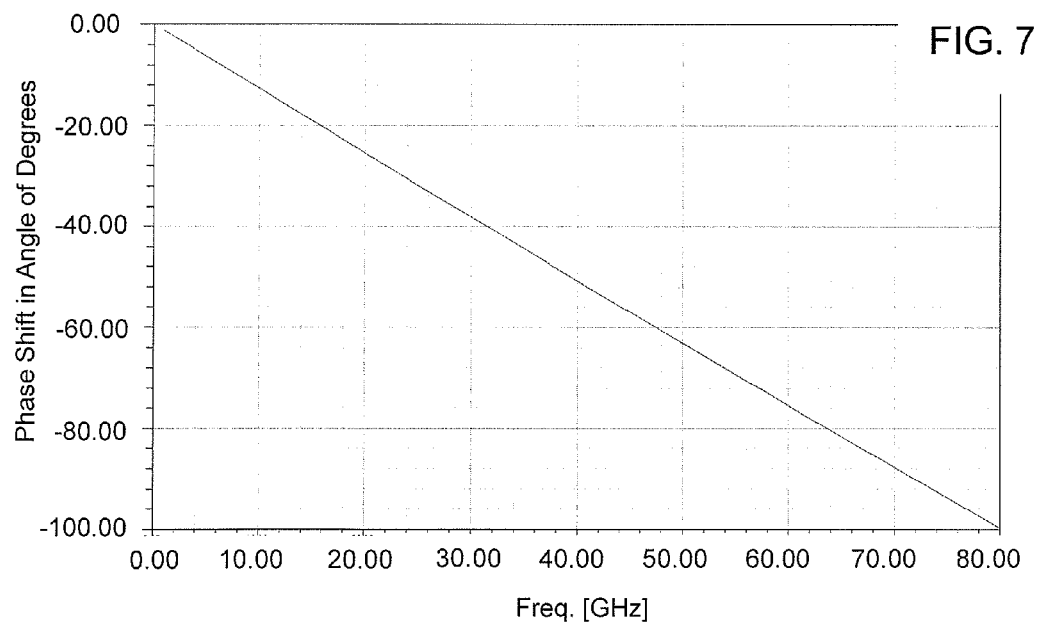

FIG. 7 shows phase delay for the 3D branchline coupler in accordance with aspects of the present invention. In FIG. 7, the x axis is frequency and the y axis is representative of a phase shift in angle of degrees. More particularly, FIG. 7 shows that there is a 90° phase delay at a frequency of 72 GHz in the vertical section (as discussed with regard to FIGS. 1 and 2).

Figure 8:
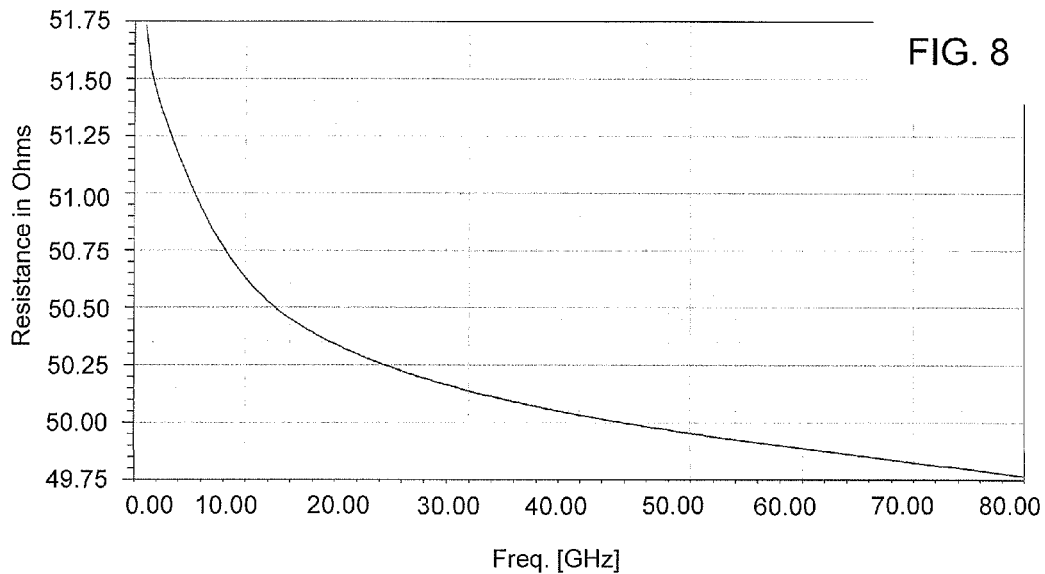

FIG. 8 shows impedance for a horizontal section of the 3D branchline coupler in accordance with aspects of the present invention. In FIG. 8, the x axis is frequency and the y axis is resistance in ohms. More particularly, FIG. 8 shows that at a frequency of 72 GHz, the resistance is about 50 ohms in the horizontal section (as discussed with regard to FIGS. 1 and 2).

Figure 9:
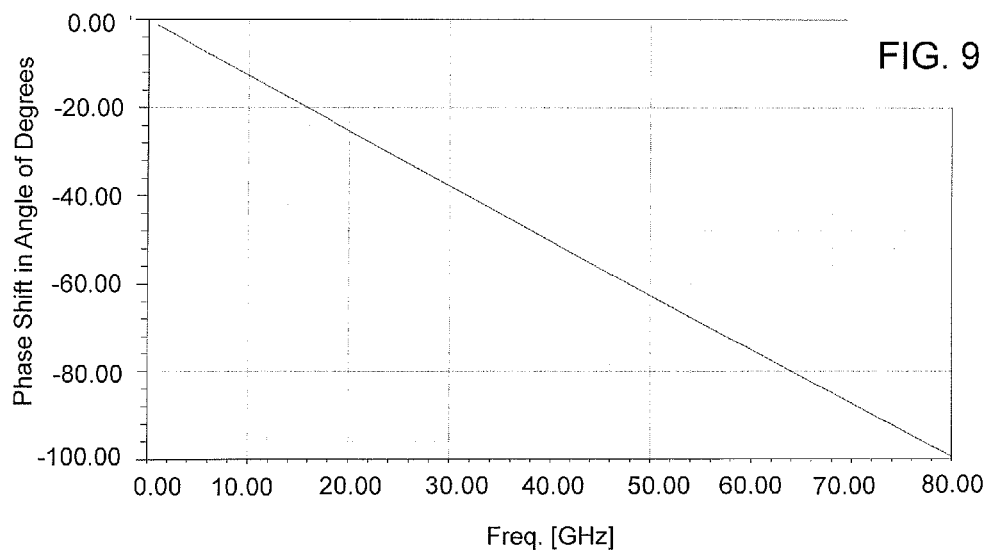

FIG. 9 shows phase delay for a horizontal section of the 3D branchline coupler in accordance with aspects of the present invention. In FIG. 9, the x axis is frequency and the y axis is representative of a phase shift in angle of degrees. More particularly, FIG. 9 shows that there is a 90° phase delay at a frequency of 72 GHz in the horizontal section (as discussed with regard to FIGS. 1 and 2).

Figure 10:
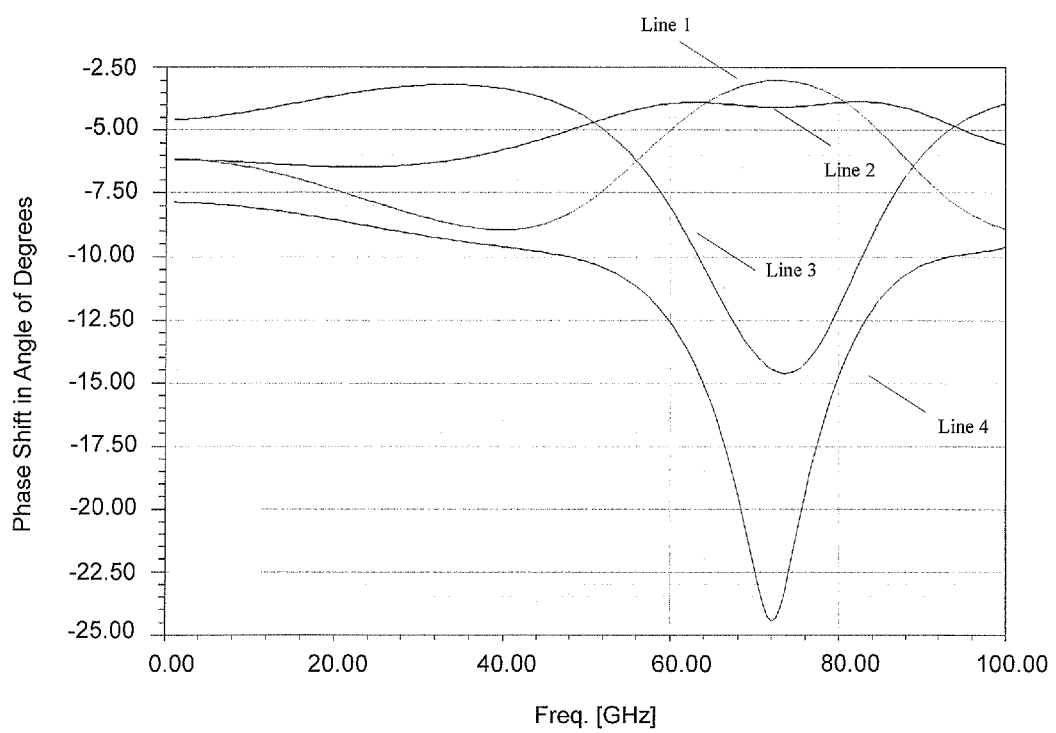

FIG. 10 shows S-parameters of the 3D branchline coupler in accordance with aspects of the present invention. In FIG. 10, the x axis is frequency and the y axis is representative of a phase shift in angle of degrees. FIG. 10 shows good input matching for the input signal at port 1 (Vin). More particularly, FIG. 10 shows the following conditions at a frequency of 300 GHz, Line 1 and Line 2 are approximately equal, with a phase delay of about −2.5° at 300 GHz;
Line 3 shows a phase delay of about −15° at 300 GHz; and
Line 4 shows a phase delay of about −25° at 300 GHz.

Figure 11:
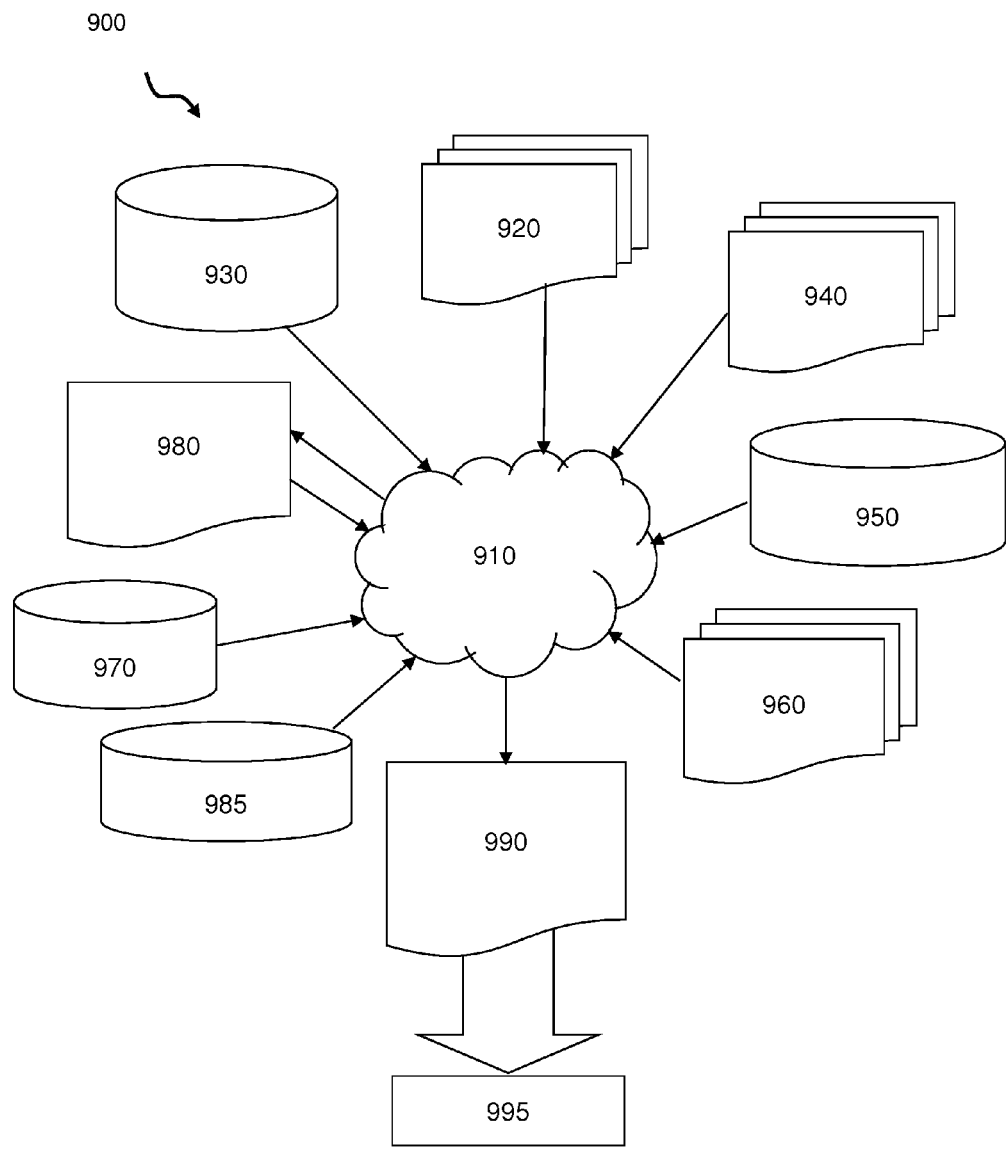
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures in any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 990 may comprise a compiled, executable HDL simulation model that functionally simulates the devices shown in FIGS. 1-5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    forming a first waveguide structure in a first dielectric material;
    forming a second waveguide structure in a second dielectric material; and
    forming through silicon vias through a substrate formed between the first dielectric material and the second dielectric material, which connects the first waveguide structure to the second waveguide structure.

2. The method of claim 1, wherein:
    the first waveguide structure comprises forming a signal line and ground plates on opposing sides of the signal line; and
    the second waveguide structure comprises forming a signal line and ground plates on opposing sides of the signal line of the second waveguide structure.

3. The method of claim 2, wherein:
    ends of the signal lines of the first waveguide structure and the second waveguide structure are formed in contact with one another by the through silicon vias at an approximate 90 degree angle; and
    ends of the ground plates of the first waveguide structure and the second waveguide structure are formed in contact with one another by the through silicon vias at an approximate 90 degree angle.

4. The method of claim 3, wherein the substrate is silicon material sandwiched between the first dielectric material and the second dielectric material.

5. The method of claim 1, wherein:
    the first waveguide structure is formed with a first port, Vin and a second port isolated from the first port Vin; and
    the second waveguide structure is formed with a first port at a phase delay of Vin <−90° and a second port at a phase delay of Vin <−180°, both with respect to the first port, Vin, of the first waveguide structure.

6. The method of claim 1, wherein the first waveguide structure is formed with a first port, Vin, split into two quadrature signals at second and third of equal amplitude and with a 90° phase difference of the second waveguide structure.

7. The method of claim 1, wherein:
    the signal line and ground plates of the first waveguide structure are formed in a same processing step; and
    the signal line and ground plates of the coplanar waveguide structure are formed in a same processing step.

8. The method of claim 7, wherein the through silicon vias are formed at an approximately 90 degree angle from each of the first waveguide structure and the second waveguide structure.

9. The method of claim 1, wherein outputs associated with Vin of ports of the second waveguide structure are delayed with respect to a Vin associated with the first waveguide structure.

10. The method of claim 1, wherein the through silicon vias are copper structures, formed extending between and in direct contact with the first waveguide structure and the second waveguide structure.

11. The method of claim 1, wherein first and second waveguide structures are formed as coplanar waveguide structures.

12. The method of claim 11, wherein the first coplanar waveguide structure and the second coplanar waveguide structure are formed using complementary metal oxide semiconductor (CMOS) technology.

13. A structure, comprising:
    a first waveguide structure in a first dielectric material;
    a second waveguide structure in a second dielectric material; and
    through silicon vias through a substrate formed between the first dielectric material and the second dielectric material, which connects the first waveguide structure to the second waveguide structure,
    wherein the first waveguide structure is formed with a first port, Vin, split into two quadrature signals at second and third of equal amplitude and with a 90° phase difference of the second waveguide structure.

14. The structure of claim 13, wherein:
    the first waveguide structure comprises a signal line and ground plates on opposing sides of the signal line of the first waveguide structure;
    the second waveguide structure comprises a signal line and ground plates on opposing sides of the signal line of the second waveguide structure;
    ends of the signal lines of the first waveguide structure and the second waveguide structure are in contact with one another by the through silicon vias; and
    ends of the ground plates of the first waveguide structure and the second waveguide structure are in contact with one another by the through silicon vias.

15. The structure of claim 13, wherein:
    the first waveguide structure comprises a first port, Vin and a second port isolated from the first port Vin; and
    the second waveguide structure comprises a first port at a phase delay of Vin <−90° and a second port at a Vin <−180°, both with respect to the first port, Vin of the first coplanar waveguide structure.

16. The structure of claim 13, wherein the through silicon vias are at an approximately 90 degree angle from each of the first waveguide structure and the second waveguide structure.

17. The structure of claim 13, wherein outputs associated with Vin of ports of the second waveguide structure are delayed with respect to a Vin associated with the first waveguide structure.

18. A design structure readable by a machine used in design, manufacture, or simulation of an integrated circuit, the design structure being implemented in the machine and comprising:
- a first waveguide structure in a first dielectric material;
- a second waveguide structure in a second dielectric material; and
- through silicon vias through a substrate formed between the first dielectric material and the second dielectric material, which connects the first waveguide structure to the second waveguide structure,
- wherein the first waveguide structure is formed with a first port, Vin, split into two quadrature signals at second and third of equal amplitude and with a 90° phase difference of the second waveguide structure.

19. The design structure of claim 18, wherein the design structure comprises a netlist.

20. The design structure of claim 18, wherein the design structure resides on storage medium as a data format used for the exchange of layout data of integrated circuits or in a programmable gate array.

\* \* \* \* \*